(12) United States Patent
Meier et al.

(10) Patent No.: US 6,309,906 B1
(45) Date of Patent: *Oct. 30, 2001

(54) PHOTOVOLTAIC CELL AND METHOD OF PRODUCING THAT CELL

(75) Inventors: Johann Meier; Ulrich Kroll, both of Corcelles (CH)

(73) Assignee: Universite de Neuchatel-Institut de Microtechnique, Neuchatel (CH)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/101,117

(22) PCT Filed: Oct. 30, 1996

(86) PCT No.: PCT/CH96/00382

§ 371 Date: Jun. 30, 1998

§ 102(e) Date: Jun. 30, 1998

(87) PCT Pub. No.: WO97/24769

PCT Pub. Date: Jul. 10, 1997

(30) Foreign Application Priority Data

Jan. 2, 1996 (FR) .................................... 96 00105

(51) Int. Cl.[7] .................. H01L 31/20; H01L 31/075; H01L 21/00
(52) U.S. Cl. ................... 438/69; 438/71; 438/93; 438/96; 438/485; 257/431; 257/63; 257/458
(58) Field of Search ................. 438/69, 71, 93, 438/96, 483, 485, 489, 759; 257/431, 63, 458

(56) References Cited

U.S. PATENT DOCUMENTS

4,910,153 * 5/1990 Dickson ................................. 438/96
5,403,404 * 4/1995 Arya et al. ........................... 136/249

OTHER PUBLICATIONS

H. Sannoniya et al. "Application of P–Type Microcrystalline Silicon to a–Si Alloy Solar Cells", IEEE, pp. 405–408, Dec. 1994.*

Y. S. Tsuo et al. "Solar Cell Structures Combining Amorphous, Microcrystalline, And Single–Crystalline Silicon", IEEE, pp. 281–285, Jan. 1993.*

(List continued on next page.)

Primary Examiner—Carl Whitehead, Jr.
Assistant Examiner—Maria Guerrero
(74) Attorney, Agent, or Firm—Davis & Bujold, P.L.L.C.

(57) ABSTRACT

The device (10) comprises a deposition chamber (12) containing two electrodes (13, 14), one of which comprises a support (16) for a substrate (17) and is earthed, the other being connected to an electric radio frequency generator (15). The device includes a mechanism (23) for extracting gas from the chamber (12) and a mechanism (18) for supplying gas. The device also comprises a mechanism for purification (31) of the gases introduced into the chamber, these a mechanism being arranged so as to reduce the number of oxygen atoms contained in the deposition gas, such gas being made up of silane, hydrogen and/or argon. The procedure consists of creating a vacuum in the deposition chamber (12), purifying the gases using purification a mechanism (31), introducing these purified gases into the chamber (12), then creating a plasma between the electrodes (13, 14). A film of intrinsic microcrystalline silicon in then deposited on the substrate.

22 Claims, 2 Drawing Sheets

OTHER PUBLICATIONS

G. A. Hirata et al. "The Role of an Amorphous SiC:H "Buffer" in the High–Performance Micro–SiC:H/a–SiC:H/poly–Si Heterojunction Solar Cells", IEEE, pp. 562–564, Oct. 1991.*

K. Kawabata et al. "Formation of PN Junction with Hydrogenated Microcrystalline Silicon", IEEE, pp. 659–663, 1990.*

J. K. Rath et al. "Development of Amorphous Silicon Based PIN Solar Cell in a Superstrate Structure wit P–Microcrystalline Silicon as Window Layer", IEEE, pp. 1101–1104, May 1996.*

A. J. McEvoy et al. "Nanocrystalline Electrochemical Solar Cells", IEEE, pp. 1779–1782, Dec. 1994.*

J. Meier et al. "Intrinsic Microcrystalline Silicon—A Promising New Thin Film Solar Cell Material", IEEE, pp. 409–412, Dec. 1994.*

12th European Photovoltaic Solar Energy Conference in Amsterdam, The Netherlands on Apr. 11–15, 1994, XP002016747, J. Meier et al., "Microcristalline Silicon P–I–N solar cells prepared by very high frequency glow discharge", pp. 1237–1240 (to follow).

Applied Physics Letters, vol. 65, No. 7, Aug. 15, 1994, XP000464558, J. Meier et al., "Complete microcristalline p–i–n solar cell–Crystalline or amorphous cell behavior?", pp. 860–862. (to follow).

1994 IEEE First World Conference on Photovoltaic Energy Conversion in Waikoloa, Hawaii on Dec. 5–9, 1994, XP000604456, J. Meier et al., "Intrinsic microcrystalline silicon promising new thin film solar cell material", pp. 409–412. (to follow).

Amorphous Silicon Technology 1995–Material Research Society Symposium Proceedings in San Francisco, California on Apr. 18–21, 1995, XP002016745, U. Kroll et al., "Origin and incorporation mechanism for oxygen contaminants in a–Si :H and uc–Si :H films prepared by the very high frequency (70 MHz) glow discharge technique", pp. 39–44. (to follow).

13th European Photovoltaic Solar Energy Conference in Nice, France on Oct. 23–27, 1995, XP002016746, J. Meier et al., "The "micromorph" solar cells: a new way to high effiecincy thin film silicon solar cells", pp. 1445–1450. (to follow).

13th European Photovoltaic Solar Energy Conference in Nice, France on Oct. 23–27, 1995, XP00201674, P. Torres et al., "Very low temperature epitaxial growth of <p>–type Silicon for solar cells", pp. 1638–1641. (to follow).

* cited by examiner

PHOTOVOLTAIC CELL AND METHOD OF PRODUCING THAT CELL

The present invention relates on the one hand to a process for the deposition of at least one layer of intrinsic microcrystalline or nanocrystalline hydrogenated silicon on a substrate, this process comprising at least one stage consisting of cleaning the substrate, placing this substrate in a deposition chamber and introducing at least one deposition gas into the said chamber.

It further concerns a device for depositing at least one layer of intrinsic microcrystalline or nanocrystalline hydrogenated silicon on a substrate, said device comprising at least one deposition chamber containing two electrodes and a support to hold said substrate, means for eliminating gases from the chamber, and means for introducing at least one deposition gas into the chamber.

In addition, it concerns a photovoltaic cell consisting of at least one substrate, one layer of transparent conductive oxide, at least one layer of hydrogenated silicon consisting of a sub-layer of positively-doped hydrogenated silicon, a sub-layer of intrinsic hydrogenated silicon and a sub-layer of negatively-doped hydrogenated silicon.

BACKGROUND OF THE INVENTION

In manufacturing photovoltaic cells, in particular, layers of amorphous silicon currently are used as active photovoltaic layers. One problem with such layers is that they degrade when exposed to light. This degradation is known as Straebler-Wronski degradation. The output of solar cells using this material deteriorates quickly.

Experiments using microcrystalline silicon, also called nanocrystalline silicon, in such solar cells nearly always yielded poor results. The high rate of defects in this type of layer effectively prohibits its use, and only a portion of the microcrystalline silicon layer participates in collecting charge conductors. Thus, the resulting photocurrent is weak and the cell is not very useful. These flaws have been attributed to the material itself, which is often considered useless.

Certain studies published in *Appl. Phys. Lett.* 65(7), p. 860, Aug. 15, 1994 entitled "Complete Microcrystalline p-i-n Solar Cell—Crystalline or Amorphous Cell Behavior?" by M. M. Meier, Flückiger, Keppner and Shah, demonstrate an involuntary doping phenomena. Depositing a layer of silicon using a conventional method such as vapor deposition known as "CVD" (Chemical Vapor Deposition) or plasma deposition in the presence of silane results in a slightly negatively-doped layer. This negative doping results in a layer that is of little or no use in a photovoltaic cell.

Experiments have been performed with a deposition method which would eliminate this negative doping. They consist of adding to the deposition gas a gas that produces positive doping to compensate for the involuntary negative doping of the microcrystalline silicon layer. This method is described in the document "IEEE 1994," p. 409–412, entitled "Intrinsic Microcrystalline Silicon—A Promising New Thin Film Solar Cell Material" by M. M. Meier, Dubail., Flückiger, Fischer, Keppner and Shah. While it produces particularly interesting results, it is difficult to apply in industry. The amount of doping gas to be introduced into the deposition chamber depends upon a certain number of parameters that are difficult to master. These parameters consist of the quantity of desorption of gas in the deposition chamber, the flux speed of the gas, and the speed at which the layer is deposited. This method has demonstrated the feasibility of a layer using this type of material. It also demonstrates the interest that such a layer has for manufacturers of solar cells but, because of difficulties encountered in controlling the deposition parameters, there has been no industrial application of the method and it remains uniquely a laboratory procedure.

SUMMARY OF THE INVENTION

The present invention proposes to overcome these difficulties with an industrial method for depositing a layer of intrinsic microcrystalline or nanocrystalline hydrogenated silicon with very few flaws, as well as a device using the method of the invention. The present invention further proposes the industrial manufacture of components such as solar cells with electrical qualities and stability far superior to similar prior art components. In addition, the invention offers a means of attaining relatively high deposition speed to improve manufacturing methods substantially.

These objects are achieved by a process as defined in the precharacterizing clause and characterized in that a purification stage of at least one of the gases which make up the deposition gas is performed before its introduction into the deposition chamber.

According to the preferred embodiment of the process, the purification stage of at least one of the gases which make up the deposition gas comprises at least one stage for the partial elimination of the molecules including oxygen and contained in this gas.

According to a first embodiment a plasma is formed in the deposition chamber, this plasma being formed by the deposition gas containing the said purified gas.

The plasma Formation step advantageously includes a stage consisting of generating radiofrequencies of frequency f determined in the deposition gas containing the said purified gas.

The said radiofrequencies are advantageously generated at a frequency f of greater than 40 MHz.

According to a second embodiment, the plasma formation stage includes a stage consisting of generating microwaves in the deposition gas containing the said purified gas.

According to a third embodiment, the said layer of intrinsic microcrystalline or nanocrystalline hydrogenated silicon is deposited by chemical vapor deposition in the presence of the deposition gas containing the said purified gas.

According to various embodiments, the deposition gas may contain at least hydrogen and silane, argon and silane or hydrogen, argon and silane.

All the gases making up the deposition gas are advantageously purified.

According to a preferred embodiment the deposition gas contains a proportion of silane of between 0.5% and 15%.

These objects are also achieved by a device as defined in the precharacterizing clause and characterized in that it also comprises a purification means of at least one of the gases which make up the deposition gas. Said means advantageously comprises at least one device which partially eliminates molecules comprising oxygen and contained in said gas.

According to one advantageous embodiment, the device further comprises means for forming a plasma in said deposition chamber said plasma being formed by the deposition gas containing said purified gas.

According to another preferred embodiment, the device includes means of generating a radiofrequency of a frequency f determined within the plasma. Said means preferably generate a frequency higher than 40 MHz.

According to one variation, the device comprises means for generating microwaves in said plasma.

According to various embodiments, the deposition gas may contain at least hydrogen and silane, argon and silane, or hydrogen, argon and silane.

The purification means preferably purify all the gases which constitute the deposition gases.

According to one preferred embodiment, the proportion of silane in the deposition gas ranges from 0.5% to 15%.

The objects of the invention are also achieved by a photovoltaic cell such as that described in the preamble and characterized in that the layer of hydrogenated silicon consists of microcrystalline or nanocrystalline hydrogenated silicon, and further in that the sub-layer of intrinsic microcrystalline or nanocrystalline silicon contains less than $2 \cdot 10^{19}$ atoms of oxygen per $cm^3$.

According to one advantageous embodiment, the photovoltaic cell further comprises a rear contact layer and a rear reflective layer, said rear contact layer forming a contact with the layer of negatively-doped microcrystalline hydrogenated silicon.

According to one preferred embodiment, the photovoltaic cell comprises a layer of amorphous hydrogenated silicon consisting of one sub-layer of positively-doped amorphous hydrogenated silicon, one sub-layer of intrinsic amorphous hydrogenated silicon, and one sub-layer of negatively-doped amorphous hydrogenated silicon, said layer being situated between the layer of transparent conductive oxide and the layer of microcrystalline or nanocrystalline hydrogenated silicon, said sub-layer of intrinsic microcrystalline or nanocrystalline hydrogenated silicon containing less than $2 \cdot 10^{19}$ atoms of oxygen per $cm^3$.

According to another advantageous embodiment, the photovoltaic cell comprises two layers of amorphous hydrogenated silicon, each consisting of a sub-layer of positively-doped amorphous hydrogenated silicon, one sub-layer of intrinsic amorphous hydrogenated silicon, and one layer of negatively-doped amorphous hydrogenated silicon, with the two layers of amorphous hydrogenated silicon being located between the layer of transparent conductive oxide and the layer of microcrystalline or nanocrystalline hydrogenated silicon said sub-layer of intrinsic microcrystalline or nanocrystalline hydrogenated silicon containing less than $2 \cdot 10^{19}$ atoms of oxygen per $cm^3$.

According to a variation, the photovoltaic cell comprises at least two layers of hydrogenated silicon, each consisting of one sub-layer of positively-doped hydrogenated silicon, one sub-layer of intrinsic hydrogenated silicon, and one sub-layer of negativelydoped hydrogenated silicon, with all the positively-doped sub-layers interconnected by at least one positive lateral channel, all the negatively-doped sub-layers interconnected by at least one negative lateral channel, and each positive lateral channel being located close to and parallel to one of the negative lateral channels; said lateral channels are separated by a metal channel, and the layers of hydrogenated silicon consisting of microcrystalline or nanocrystalline hydrogenated silicon and the sub-layers of intrinsic microcrystalline or nanocrystalline hydrogenated silicon contain less than $2 \cdot 10^{19}$ atoms of oxygen per $cm^3$.

According to a first embodiment, the substrate is transparent and located on the same side as the layer of transparent conductive oxide.

According to a second embodiment, the substrate is located on the side opposite the layer of transparent conductive oxide.

BRIEF DESCRIPTION OF THE DRAWINGS

The present invention will be better understood by reference to different non-restrictive embodiments of the invention and to the accompanying drawings, in which.

DESCRIPTION OF THE PREFERRED EMBODIMENT(S)

Figure 1:
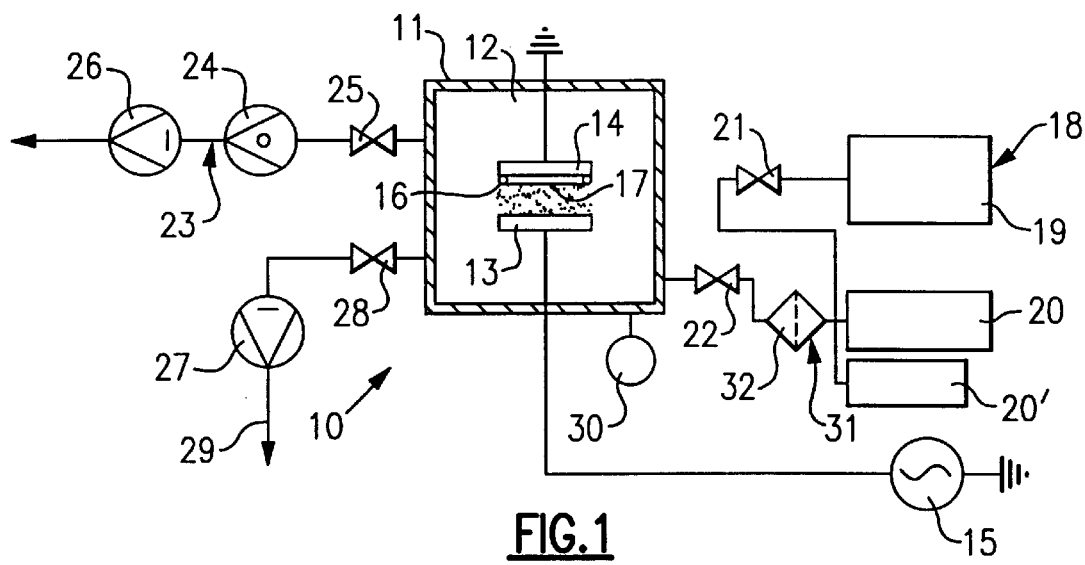
FIG. 1 shows the deposition device according to the present invention.

With reference to FIG. 1, the device 10 comprises a plasma reactor 11 consisting of a deposition chamber 12 containing a first electrode 13 which may be connected, for example, to an electrical radiofrequency generator 15, and a second grounded electrode 14. The electrodes are situated opposite each other. The second electrode 14 comprises a support 16 for attaching a substrate 17, which may consist, for example, of a thin plate of glass. The two electrodes, together with the substrate, form a capacitor element for creating a plasma from high frequency electrical discharges between the electrodes when there is gas inside deposition chamber 12.

Device 10 also includes other gas supply means 18, specifically, one or more gas reservoirs 19. 20, 20' and corresponding pressure regulators 21, 22 to introduce various pure or mixed gases into reactor chamber 12 through one or more inlet valves. Said device 10 also has means 23 for extracting gases from the chamber. In FIG. 1 there is a turbo-molecular pump 24 with the aspiration element connected to chamber 12 through a valve 25, said pump 24 being accompanied by a first primary pump 26. A second primary pump 27 is connected to chamber 12 through valve 28, with the outlet of this pump communicating with gas evacuation circuit 29. A pressure gauge 30 which indicates pressure within deposition chamber 12 is also shown in the drawing. In addition, there are several devices (not shown) for heating and cooling the electrodes, the substrate, and the chamber.

Finally, device 10 includes means 31 for purifying at least one gas introduced into the chamber. Specifically, said purification means comprise a device 32 for partial elimination of the oxygen from the gas used for deposition, whatever the chemical form of the oxygen within the gas might be. A similar purification device is known commercially as the Mono Torr™ Silane Gas Purifier manufactured by SAES Pure Gas, Inc.

The process according to the present invention essentially occurs in a conventional manner and comprises a substrate preparation stage, a device conditioning stage enabling deposition and an actual deposition stage.

In the substrate preparation stage, this substrate 17 which could be glass, metal or synthetic material for example, is cut to the appropriate dimensions, then cleaned in several water and alcohol baths. It is then mounted on the support 16 and fixed to the second electrode 14 of the deposition chamber 12.

In the system conditioning stage, the chamber is pumped out by means of different pumps 24, 26 and 27 until a pressure of less than $10^{-4}$ Pa is obtained. Then the deposition chamber 12 is degassed so as to eliminate the oxygen and its constituents contained in the walls of this chamber to the greatest possible extent.

In the deposition stage, which is new in comparison with the known stages of the prior art, the gas supply means 18 are connected so as to supply pure hydrogen and/or argon and a gas comprising a silicon compound such as silane ($SiH_4$) into the deposition chamber 12. This silane is diluted in the mixture of hydrogen and argon in such a manner that the mixture of these three gases contains a quantity of silane of approximately 3%. It is also possible to use only hydrogen and silane, or argon and silane. However, using a mixture of hydrogen, argon and silane speeds the deposition of the microcrystalline layer considerably.

The gases supplied by the gas supply means are introduced into the purification means 31 before their introduction into the deposition chamber, so as to eliminate to the greatest possible extent the oxygen contained in these gases whatever the chemical form of the oxygen. This purification is indispensable, failing which the layer obtained will be unusable.

The valve 28 is opened and the pump 27 is activated so as to keep a determined absolute pressure p in the enclosure. As soon as the pressure has been stabilized, the generator 15 is engaged to produce a plasma between both electrodes, and more precisely between the substrate 17 and the first electrode 13. It is important that the plasma is more or less confined to the zone between the two electrodes, thanks to a sensible choice of the parameters such as pressure, distance and density of electrical power.

The plasma used for deposition may have any frequency. However, the speed of growth of the layer is greater when the frequency is high. As the risk of contamination of the layer is inversely proportional to the deposition speed, it is more advantageous to deposit the layer at a frequency higher than or equal to 40 MHz. It should however be noted that deposition methods using a conventional frequency of 13.56 MHz also give good quality layers.

Moreover, other known deposition processes may also be used. These processes are in particular the chemical vapor deposition process known under the abbreviation CVD, a process using a heated filament known under the name "hot-wire technique," a deposition process known under the name "remote plasma" in which a plasma is produced outside the deposition chamber and subsequently introduced into this chamber, and a process in which a plasma is created by excitation by microwaves.

Figure 2:
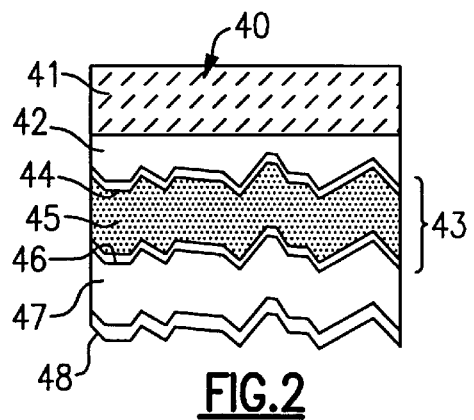

FIGS. 2 through 5 illustrate four embodiments of photovoltaic cells according to the present invention. In particular, FIG. 2 shows a simple photovoltaic cell 40 comprising a transparent substrate 41 with a layer of transparent conductive oxide 42 deposited thereon. The substrate may be made, for example, of 0.8 mm thick Dow Corning® glass.

The next layer acts as the active photovoltaic layer and it is composed of three "sub-layers" forming a p-i-n junction. Said layer 43 consists of hydrogenated microcrystalline or nanocrystalline silicon, while sub-layer 44 closest to substrate 41 is positively doped, intermediate sub-layer 45 is intrinsic, and the final sub-layer 46 is negatively doped. Microcrystalline layer 43 contains very little oxygen, thereby making it possible to obtain a high quality layer that can be used for a photovoltaic cell. According to actual experiments, the number of oxygen atoms per cubic centimeter of deposited material should be lower than $2 \cdot 10^{19}$ to achieve a photovoltaic cell in which the entire layer of microcrystalline hydrogenated silicon is photovoltaically active. The typical oxygen content in the deposited layer of microcrystalline silicon according to the method of the present invention is of the order of $10^{18}$ atoms per $cm^3$. The photocurrent obtained with such a cell is thus higher than 20 $mA/cm^2$ for a normalized spectrum AM 1.5.

Finally, the cell includes a rear contact layer 47 which may be made of zinc oxide and a reflective layer 48 made of silver or aluminum to send incident beams through the cell.

The diminished quantity of oxygen present during deposition of the nanocrystalline or microcrystalline hydrogenated silicon layer considerably decreases the number of flaws that oxygen would cause in this layer, thereby making the layer suitable for use in a solar cell. Cells made with such layers have proven substantially more stable when subjected to intense light beams than conventional cells using amorphous silicon.

Figure 3:
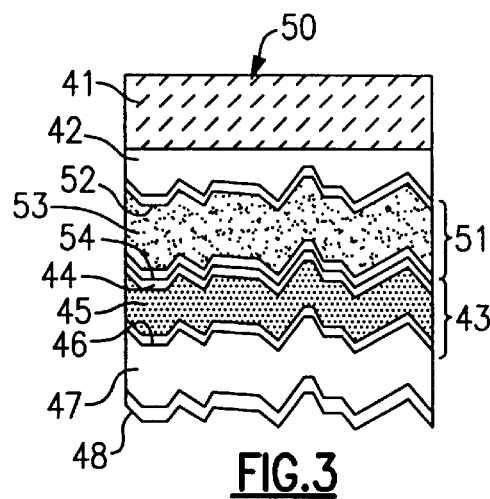

FIG. 3 shows a cell 50 with a general structure known as "tandem" structure. As in the cell illustrated in FIG. 2, it comprises a substrate 41, a layer of transparent conductive oxide 42, a layer of microcrystalline hydrogenated silicon 43 formed of three sub-layers 44, 45. 46 identical to the sub-layer of the cell of FIG. 2, a rear contact layer 47 and a reflective layer 48. Said cell further comprises a layer of amorphous hydrogenated silicon 51 consisting of three sub-layers 52, 53, 54 which are positively-doped, intrinsic, and negatively-doped, respectively, and which form a p-i-n junction. Said layer 51 is located between the oxide layer 42 and the microcrystalline layer 43.

In a cell with such a tandem structure, the two layers 43 and 51 of hydrogenated silicon are made to be sensitive to various wave lengths of incident light. This sensitivity to certain wave lengths depends upon the blocked band of material forming the layer. The use of a layer of amorphous silicon and a layer of microcrystalline silicon facilitates formation of layers with blocked bands for maximum use of light.

Figure 4:
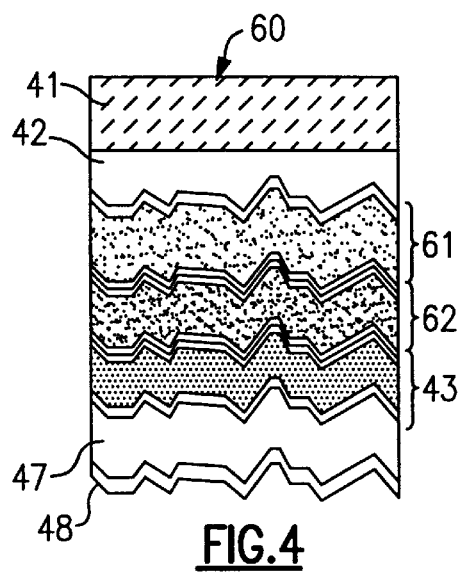

FIG. 4 illustrates one embodiment of a triple photovoltaic cell 60 consisting of a substrate 41, a layer of transparent conductive oxide 42, a first layer 61 of amorphous hydrogenated silicon similar to layer 51 of cell 50 in FIG. 3, a second layer 62 of amorphous hydrogenated silicon also similar to layer 51 in FIG. 3, and a layer 43 of microcrystalline hydrogenated silicon similar to layer 43 in FIG. 3.

These three layers form three p-i-n junctions and each has a different blocked band, making them sensitive to different wave lengths and optimizing the use of light penetrating each photovoltaic cell. The first layer 61 of amorphous hydrogenated silicon may contain carbon, increasing the blocked band in relation to a similar layer of amorphous hydrogenous silicon with no supplementary elements. The second layer 62 of amorphous hydrogenated silicon may contain germanium in order to decrease the blocked band in the layer.

Figure 5:
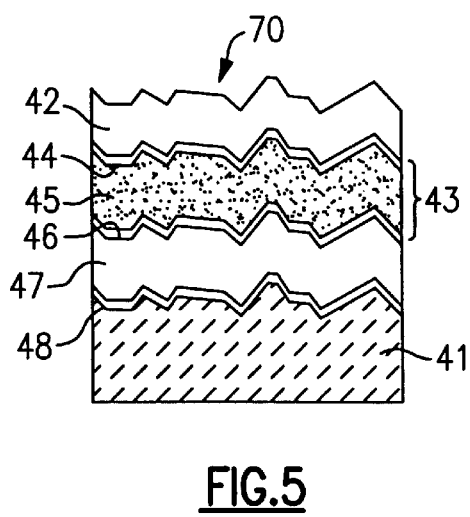

FIG. 5 shows a simple photovoltaic cell 70, of the same type shown in FIG. 2, consisting of the same layers as cell 40. One essential difference between these two cells is that light does not pass through substrate 41. It penetrates the cell through the side opposite the substrate. The substrate serves as a support for tile layers and thus it may be opaque. This means that it may be made from a more broad range of materials. Specifically, it may include metal or a synthetic material with suitable physical properties. Since light must always penetrate a photovoltaic cell through the positively-doped sub-layer, the first layer to be deposited on the substrate is a negatively-doped layer, whereas, in the case of FIGS. 2 through 4, this layer is positively-doped. The layer forms a p-i-n junction in the example of FIG. 5.

Figure 6:
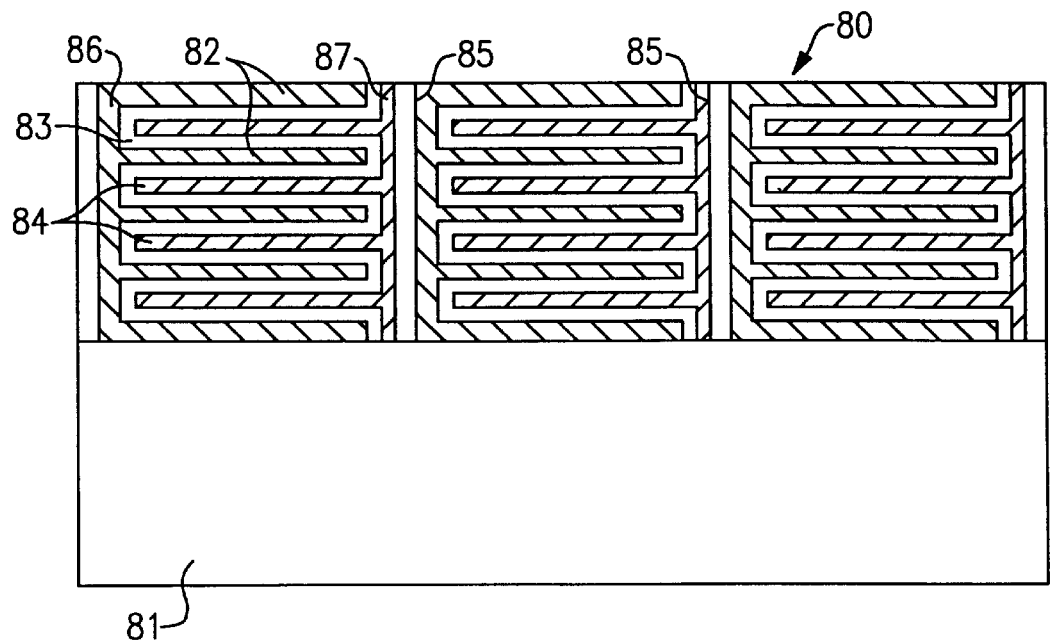
FIGS. 2 through 6 show four types of embodiments of photovoltaic cells according to the present invention.

FIG. 6 is a transverse cross-section of one embodiment of a photovoltaic cell 80 comprising a substrate 81 with several layers of hydrogenated microcrystalline silicon 82, 83, 84 deposited thereon, which are respectively negatively-doped (82), intrinsic (83), and positively-doped (84). In this embodiment, the layers forming the p-i-n junctions are arranged in columns, with the columns separated by a metal channel 85. Furthermore, all the negatively-doped layers 82 in a column are interconnected by one lateral negative channel 86. Similarly, all the positively-doped layers 84 in a column are interconnected by a positive lateral channel 87. As in the embodiments described above, the layers of intrinsic silicon are deposited after partially eliminating the molecules containing oxygen. In this embodiment it is possible to form a large stack of layers forming p-i-n junctions.

The process enables a layer of intrinsic microcrystalline hydrogenated silicon to be deposited industrially. The use of such a layer in solar cells brings substantial advantages from the point of view of their efficiency and their durability.

The present invention is not restricted to the embodiments described, but extends to any modification or refinement evident to the person skilled in the art. In particular, a deposition device that is different from the one described may be used, so long as the device has means to reduce the amount of oxygen in the deposition gas.

Similarly, the use of a layer of microcrystalline silicon is not limited to photovoltaic cells as described herein, but extends to any variation where using such a layer would be beneficial, either from the technical standpoint of increased output or an economic standpoint such as production cost.

It is also possible to use the layer of intrinsic microcrystalline hydrogenated silicon which is "poor" in oxygen in components other than photovoltaic cells. In particular, such a layer may be used in detectors such as infrared detectors, optoelectronic detectors, x-ray detectors, or position detectors.

What is claimed is:

1. A method for producing a photovoltaic cell, comprising the steps of:
   cleaning a substrate;
   placing the substrate in a deposition chamber;
   purifying at least one deposition gas containing silicon to reduce an oxygen content of the at least one deposition gas;
   introducing the at least one deposition gas, following purification of the at least one deposition gas, in the chamber; and
   depositing at least one hydrogenated layer comprising a microcrystalline hydrogenated silicon or a nanocrystalline hydrogenated silicon on the substrate with the deposited at least one hydrogenated layer comprising a first external sub-layer, a second external sub-layer and a third sub-layer located between the first external sub-layer and the second external sub-layer; one of the first external sub-layer and the second external sub-layer comprising a positively-doped hydrogenated silicon and the other of the first external sub-layer and the second external sub-layer comprising a negatively-doped hydrogenated silicon; the third sub-layer comprising an intrinsic hydrogenated silicon containing less than $2 \times 10^{19}$ atoms of oxygen per cm$^3$ with the third sub-layer being deposited without micro-doping; and the photovoltaic cell having a photocurrent density which is higher than 20 mA/cm$^2$ for normalized spectrum AM 1.5.

2. The method according to claim 1, further comprising the step of forming the at least one deposition gas into a plasma during the depositing step.

3. The method according to claim 2, further comprising the step of forming the plasma by excitation of the at least one deposition gas with microwaves.

4. The method according to claim 2, further comprising the step of using chemical vaporization of the at least one deposition gas as the depositing step.

5. The method according to claim 2, further comprising the step of using silane as the at least one deposition gas.

6. The method according to claim 2, further comprising the step of using between 0.5% to 15% of silane as the at least one deposition gas.

7. The method according to claim 2, further comprising the step of forming the plasma by excitation of the at least one deposition gas with radio frequencies.

8. The method according to claim 7, further comprising the step of using radio frequencies greater than 40 MHz to excite the at least one deposition gas.

9. A photovoltaic cell comprising:
   at least one substrate having a first surface;
   a transparent layer of a conductive oxide and at least one hydrogenated layer, comprising one of a microcrystalline hydrogenated silicon or a nanocrystalline hydrogenated silicon, being deposited on the first surface of the at least one substrate, the at least one hydrogenated layer comprising a first external sub-layer, a second external sub-layer and a third sub-layer located between the first external sub-layer and the second external sub-layer; one of the first external sub-layer and the second external sub-layer comprising positively-doped hydrogenated silicon and the other of the first external sub-layer and the second external sub-layer comprising negatively-doped hydrogenated silicon; the third sub-layer comprising an intrinsic hydrogenated silicon containing less than $2 \times 10^{19}$ atoms of oxygen per cm$^3$ with the third sub-layer being deposited on the at least one substrate without micro-doping; and
   the photovoltaic cell having a photocurrent density which is higher than 20 mA/cm$^2$ for normalized spectrum AM 1.5.

10. The photovoltaic cell according to claim 9, wherein the external sub-layer comprising negatively-doped hydrogenated silicon has a rear contact layer deposited thereon, and a reflective layer is deposited on the rear contact layer.

11. The photovoltaic cell according to claim 9, wherein the substrate supports the transparent layer of conductive oxide.

12. The photovoltaic cell according to claim 9, wherein the substrate supports the transparent layer of conductive oxide; and
   the external sub-layer comprising negatively-doped hydrogenated silicon has a rear contact layer deposited thereon, and a reflective layer is deposited on the rear contact layer.

13. The photovoltaic cell according to claim 9, wherein the external sub-layer comprising negatively-doped hydrogenated silicon has a rear contact layer deposited thereon, and a reflective layer is deposited on the rear contact layer; and
   the substrate is separated from the transparent layer of conductive oxide at least by the at least one hydrogenated layer, the rear contact layer and the reflective layer.

14. An improved photovoltaic cell comprising:

at least one substrate having a first surface;

a transparent layer of a conductive oxide and at least one hydrogenated layer, comprising a microcrystalline hydrogenated silicon or a nanocrystalline hydrogenated silicon, being deposited on the first surface of the at least one substrate, the at least one hydrogenated layer comprising a first external sub-layer, a second external sub-layer and a third sub-layer located between the first external sub-layer and the second external sub-layer; one of the first external sub-layer and the second external sub-layer comprising positively-doped hydrogenated silicon and the other of the first external sub-layer and the second external sub-layer comprising negatively-doped hydrogenated silicon; the third sub-layer comprising an intrinsic hydrogenated silicon containing less than $2 \times 10^{19}$ atoms of oxygen per cm$^3$ with the third sub-layer being deposited on the at least one substrate without micro-doping;

an amorphous hydrogenated layer being located between the transparent layer of conductive oxide and the at least one hydrogenated silicon layer, and the amorphous hydrogenated layer comprising a positively-doped hydrogenated sub-layer, an intrinsic hydrogenated sub-layer, and a negatively-doped hydrogenated sub-layer; and a cumulative photocurrent density of the at least one hydrogenated layer and the amorphous hydrogenated layer added together being higher than 20 mA/cm$^2$ for normalized spectrum AM 1.5.

15. The photovoltaic cell according to claim 14, wherein the external sub-layer comprising negatively-doped hydrogenated silicon has a rear contact layer deposited thereon, and a reflective layer is deposited on the rear contact layer.

16. The photovoltaic cell according to claim 15, wherein the substrate supports the transparent layer of conductive oxide.

17. The photovoltaic cell according to claim 15, wherein the substrate supports the transparent layer of conductive oxide; and the external sub-layer comprising negatively-doped hydrogenated silicon has a rear contact layer deposited thereon, and a reflective layer is deposited on the rear contact layer.

18. An improved photovoltaic cell comprising:

at least one substrate having a first surface;

a transparent layer of a conductive oxide and at least one hydrogenated layer, comprising a microcrystalline hydrogenated silicon or a nanocrystalline hydrogenated silicon, being deposited on the first surface of the at least one substrate, the at least one hydrogenated layer comprising a first external sub-layer, a second external sub-layer and a third sub-layer located between the first external sub-layer and the second external sub-layer; one of the first external sub-layer and the second external sub-layer comprising positively-doped hydrogenated silicon and the other of the first external sub-layer and the second external sub-layer comprising negatively-doped hydrogenated silicon; the third sub-layer comprising an intrinsic hydrogenated silicon containing less than $2 \times 10^{19}$ atoms of oxygen per cm$^3$ with the third sub-layer being deposited on the at least one substrate without micro-doping;

a first amorphous hydrogenated layer, comprising one of an amorphous silicon or an amorphous silicon alloy, being located between the transparent layer of conductive oxide and the at least one hydrogenated layer, and the first amorphous hydrogenated layer comprising a positively-doped hydrogenated sub-layer, an intrinsic hydrogenated sub-layer, and a negatively-doped hydrogenated sub-layer;

a second amorphous hydrogenated layer, comprising one of an amorphous silicon or an amorphous silicon germanium alloy, being located between the transparent layer of conductive oxide and the at least one hydrogenated layer, and the second amorphous hydrogenated layer comprising a positively-doped hydrogenated sub-layer, an intrinsic hydrogenated sub-layer, and a negatively-doped hydrogenated sub-layer; and a cumulative photocurrent density of the at least one hydrogenated layer, the first amorphous hydrogenated layer and the second amorphous hydrogenated layer added together being higher than 20 mA/cm$^2$ for normalized spectrum AM 1.5.

19. The photovoltaic cell according to claim 18, wherein the external sub-layer comprising negatively-doped hydrogenated silicon has a rear contact layer deposited thereon, and a reflective layer is deposited on the rear contact layer.

20. The photovoltaic cell according to claim 18, wherein the substrate supports the transparent layer of conductive oxide.

21. The photovoltaic cell according to claim 18, wherein the substrate supports the transparent layer of conductive oxide; and the external sub-layer comprising negatively-doped hydrogenated silicon has a rear contact layer deposited thereon, and a reflective layer is deposited on the rear contact layer.

22. A photovoltaic cell comprising:

at least one substrate having a first surface;

a plurality of hydrogenated layers comprising a microcrystalline hydrogenated silicon or a nanocrystalline hydrogenated silicon being deposited on the first surface of the at least one substrate, each of the plurality of hydrogenated layers comprising a first external sub-layer, a second external sub-layer and a third sub-layer located between the first external sub-layer and the second external sub-layer; one of the first external sub-layer and the second external sub-layer comprising positively-doped hydrogenated silicon and the other of the first external sub-layer and the second external sub-layer comprising negatively-doped hydrogenated silicon; the third sub-layer comprising an intrinsic hydrogenated silicon containing less than $2 \times 10^{19}$ atoms of oxygen per cm$^3$;

wherein each positively-doped sub-layer is interconnected by at least one positive lateral channel, and each negatively-doped sub-layer is interconnected by at least one negative lateral channel, and positive lateral channel and the negative lateral channel extend parallel to one another and are separated by a metal channel.

* * * * *